US012696802B2

(12) United States Patent (10) Patent No.: US 12,696,802 B2
Yoo et al. (45) Date of Patent: Jul. 28, 2026

(54) SEMICONDUCTOR DEVICE ASSEMBLY WITH THROUGH-PACKAGE INTERCONNECT AND ASSOCIATED SYSTEMS, DEVICES, AND METHODS

(71) Applicant: Lodestar Licensing Group LLC, Evanston, IL (US)

(72) Inventors: Chan Yoo, Boise, ID (US); Todd O. Bolken, Eagle, ID (US)

( * ) Notice: Subject to any disclaimer, the term of this patent is extended or adjusted under 35 U.S.C. 154(b) by 557 days.

(21) Appl. No.: 17/935,019

(22) Filed: Sep. 23, 2022

(65) Prior Publication Data

US 2023/0020689 A1 Jan. 19, 2023

Related U.S. Application Data

(60) Continuation of application No. 16/840,794, filed on Apr. 6, 2020, now Pat. No. 11,456,286, which is a (Continued)

(51) Int. Cl.
*H01L 25/10* (2006.01)
*H01L 21/56* (2006.01)
(Continued)

(52) U.S. Cl.
CPC ............ *H10W 90/00* (2026.01); *H10D 84/01* (2025.01); *H10W 70/40* (2026.01); *H10W 72/20* (2026.01);
(Continued)

(58) Field of Classification Search
CPC ............... H01L 25/105; H01L 23/3128; H01L 23/3142; H01L 23/495; H01L 24/03;
(Continued)

(56) References Cited

U.S. PATENT DOCUMENTS 5,055,907 A 10/1991 Jacobs
5,344,600 A 9/1994 McShane et al.
(Continued)

FOREIGN PATENT DOCUMENTS

CN 102867776 A 1/2013
JP 2000174046 A 6/2000
(Continued)

OTHER PUBLICATIONS

JP Patent Application No. 2015-552818—Japanese Office Action, mailed Jul. 25, 2017, with English Translation, 8 pages.
(Continued)

*Primary Examiner* — Peniel M Gumedzoe

(57) ABSTRACT

Methods for making semiconductor devices are disclosed herein. A method configured in accordance with a particular embodiment includes forming a spacer material on an encapsulant such that the encapsulant separates the spacer material from an active surface of a semiconductor device and at least one interconnect projecting away from the active surface. The method further includes molding the encapsulant such that at least a portion of the interconnect extends through the encapsulant and into the spacer material. The interconnect can include a contact surface that is substantially co-planar with the active surface of the semiconductor device for providing an electrical connection with the semiconductor device.

17 Claims, 10 Drawing Sheets

Related U.S. Application Data continuation of application No. 15/941,611, filed on Mar. 30, 2018, now Pat. No. 10,615,154, which is a division of application No. 15/334,069, filed on Oct. 25, 2016, now Pat. No. 9,978,730, which is a division of application No. 14/563,982, filed on Dec. 8, 2014, now Pat. No. 9,508,686, which is a division of application No. 13/739,331, filed on Jan. 11, 2013, now Pat. No. 8,906,743.

(51) Int. Cl.

| | |
|---|---|
| *H01L 21/82* | (2006.01) |
| *H01L 23/00* | (2006.01) |
| *H01L 23/31* | (2006.01) |
| *H01L 23/495* | (2006.01) |
| *H01L 25/065* | (2023.01) |
| *H10D 84/01* | (2025.01) |
| *H10W 70/40* | (2026.01) |
| *H10W 72/20* | (2026.01) |
| *H10W 74/01* | (2026.01) |
| *H10W 74/10* | (2026.01) |
| *H10W 90/00* | (2026.01) |
| *H10W 70/60* | (2026.01) |
| *H10W 70/656* | (2026.01) |
| *H10W 72/00* | (2026.01) |
| *H10W 72/29* | (2026.01) |
| *H10W 72/30* | (2026.01) |
| *H10W 72/50* | (2026.01) |
| *H10W 72/59* | (2026.01) |
| *H10W 72/90* | (2026.01) |
| *H10W 74/00* | (2026.01) |
| *H10W 90/26* | (2026.01) |

(52) U.S. Cl.
CPC ......... *H10W 74/01* (2026.01); *H10W 74/014* (2026.01); *H10W 74/016* (2026.01); *H10W 74/017* (2026.01); *H10W 74/117* (2026.01); *H10W 74/127* (2026.01); *H10W 70/60* (2026.01); *H10W 70/656* (2026.01); *H10W 72/01235* (2026.01); *H10W 72/019* (2026.01); *H10W 72/0198* (2026.01); *H10W 72/072* (2026.01); *H10W 72/07253* (2026.01); *H10W 72/073* (2026.01); *H10W 72/075* (2026.01); *H10W 72/231* (2026.01); *H10W 72/232* (2026.01); *H10W 72/234* (2026.01); *H10W 72/237* (2026.01); *H10W 72/241* (2026.01); *H10W 72/244* (2026.01); *H10W 72/252* (2026.01); *H10W 72/281* (2026.01); *H10W 72/29* (2026.01); *H10W 72/354* (2026.01); *H10W 72/5445* (2026.01); *H10W 72/551* (2026.01); *H10W 72/59* (2026.01); *H10W 72/859* (2026.01); *H10W 72/865* (2026.01); *H10W 72/877* (2026.01); *H10W 72/884* (2026.01); *H10W 72/90* (2026.01); *H10W 72/9415* (2026.01); *H10W 72/9445* (2026.01); *H10W 72/952* (2026.01); *H10W 74/00* (2026.01); *H10W 90/26* (2026.01); *H10W 90/721* (2026.01); *H10W 90/722* (2026.01); *H10W 90/724* (2026.01); *H10W 90/732* (2026.01); *H10W 90/734* (2026.01); *H10W 90/754* (2026.01)

(58) Field of Classification Search
CPC ......... H01L 24/05; H01L 24/06; H01L 24/11; H01L 24/13; H01L 24/14; H01L 24/17; H01L 24/32; H01L 24/48; H01L 24/49; H01L 24/73; H01L 24/97; H01L 2224/02377; H01L 2224/0401; H01L 2224/04042; H01L 2224/05568; H01L 2224/05573; H01L 2224/05647; H01L 2224/05655; H01L 2224/05666; H01L 2224/06177; H01L 2224/1012; H01L 2224/1146; H01L 2224/11462; H01L 2224/11464; H01L 2224/12105; H01L 2224/1301; H01L 2224/13014; H01L 2224/13017; H01L 2224/13024; H01L 2224/13144; H01L 2224/13147; H01L 2224/14051; H01L 2224/16055; H01L 2224/16057; H01L 2224/16058; H01L 2224/16145; H01L 2224/16238; H01L 2224/2919; H01L 2224/32145; H01L 2224/32225; H01L 2224/45099; H01L 2224/48091; H01L 2224/48106; H01L 2224/48227; H01L 2224/49175; H01L 2224/73207; H01L 2224/73215; H01L 2224/73253; H01L 2224/73265; H01L 2224/85; H01L 2224/92163; H01L 2224/92247; H01L 2224/97; H01L 2225/0651; H01L 2225/0652; H01L 2225/06565; H01L 2225/1023; H01L 2225/1041; H01L 2225/1058; H01L 2924/00014; H01L 2924/12042; H01L 2924/15184; H01L 2924/181; H01L 2924/351; H10D 84/01; H10W 90/00; H10W 90/732; H10W 90/26; H10W 90/724; H10W 90/754; H10W 90/721; H10W 90/722; H10W 90/734; H10W 74/017; H10W 74/127; H10W 74/014; H10W 74/01; H10W 74/016; H10W 74/117; H10W 74/00; H10W 70/40; H10W 70/20; H10W 70/60; H10W 70/656; H10W 72/877; H10W 72/07253; H10W 72/534; H10W 72/5445; H10W 72/884; H10W 72/073; H10W 72/232; H10W 72/241; H10W 72/551; H10W 72/952; H10W 72/072; H10W 72/234; H10W 72/237; H10W 72/865; H10W 72/90; H10W 72/9445; H10W 72/075; H10W 72/859; H10W 72/0198; H10W 72/29; H10W 72/231; H10W 72/59; H10W 72/019; H10W 72/9415; H10W 72/244; H10W 72/01235; H10W 72/252; H10W 72/281

See application file for complete search history.

(56) References Cited

U.S. PATENT DOCUMENTS

| | | | | |
|---|---|---|---|---|
| 6,478,562 | B1 | 11/2002 | Miyajima | |
| 7,245,008 | B2 | 7/2007 | Lee | |
| 7,572,681 | B1 | 8/2009 | Huemoeller et al. | |
| 7,989,706 | B2 | 8/2011 | Shizuno | |
| 8,125,092 | B2 * | 2/2012 | Corisis | H01L 23/3128 257/784 |
| 8,263,439 | B2 | 9/2012 | Marimuthu et al. | |
| 8,604,600 | B2 | 12/2013 | Scanlan | |
| 8,906,743 | B2 | 12/2014 | Yoo et al. | |
| 9,508,686 | B2 | 11/2016 | Yoo et al. | |
| 9,978,730 | B2 | 5/2018 | Yoo et al. | |
| 10,615,154 | B2 | 4/2020 | Yoo et al. | |
| 2003/0096454 | A1 | 5/2003 | Poo et al. | |
| 2004/0222534 | A1 * | 11/2004 | Sawamoto | H01L 23/481 257/E25.011 |
| 2004/0262734 | A1 * | 12/2004 | Yoo | H01L 25/0657 257/E25.023 |

(56)        References Cited

U.S. PATENT DOCUMENTS

| | | | |
|---|---|---|---|
| 2005/0191772 A1 | 9/2005 | Ito et al. | |
| 2005/0208707 A1 | 9/2005 | Kim et al. | |
| 2006/0043618 A1 | 3/2006 | Ashida et al. | |
| 2009/0102002 A1 | 4/2009 | Chia et al. | |
| 2009/0206461 A1* | 8/2009 | Yoon | H01L 23/3128 |
| | | | 257/737 |
| 2009/0309206 A1* | 12/2009 | Kim | H01L 24/91 |
| | | | 257/E25.027 |
| 2010/0033941 A1 | 2/2010 | Pagaila et al. | |
| 2010/0176508 A1 | 7/2010 | Herbsommer et al. | |
| 2011/0037157 A1 | 2/2011 | Shin et al. | |
| 2011/0068427 A1 | 3/2011 | Paek et al. | |
| 2011/0068481 A1* | 3/2011 | Park | H01L 23/3128 |
| | | | 257/777 |
| 2011/0101152 A1 | 5/2011 | Molstad et al. | |
| 2011/0201152 A1 | 8/2011 | Harayama et al. | |
| 2012/0013001 A1 | 1/2012 | Haba et al. | |
| 2012/0038064 A1 | 2/2012 | Camacho et al. | |
| 2012/0146235 A1 | 6/2012 | Choi et al. | |
| 2012/0211885 A1 | 8/2012 | Choi et al. | |
| 2012/0306097 A1 | 12/2012 | Kim et al. | |
| 2013/0009307 A1 | 1/2013 | Lu et al. | |
| 2013/0011964 A1 | 1/2013 | Liu et al. | |
| 2013/0154155 A1 | 6/2013 | Casabianca et al. | |
| 2013/0168849 A1 | 7/2013 | Scanlan | |
| 2014/0197526 A1 | 7/2014 | Yoo et al. | |
| 2015/0137365 A1 | 5/2015 | Yoo et al. | |
| 2017/0040303 A1 | 2/2017 | Yoo et al. | |
| 2018/0226387 A1 | 8/2018 | Yoo et al. | |
| 2020/0243493 A1 | 7/2020 | Yoo et al. | |

FOREIGN PATENT DOCUMENTS

| | | | |
|---|---|---|---|
| JP | 2000254933 A | 9/2000 |
| JP | 2001079878 A | 3/2001 |
| JP | 2004172157 A | 6/2004 |
| JP | 2005072587 A | 3/2005 |
| JP | 2010062178 A | 3/2010 |
| JP | 2010153491 A | 7/2010 |

OTHER PUBLICATIONS

Office Action mailed Jun. 26, 2020 for European Patent Application No. 14738143.8, 5 pages.
Extended European Search Report mailed Nov. 11, 2016 in European application No. 14738143.8, 11 pages.
International Search Report issued on May 16, 2014 in International Application No. PCT/US2014/011089, 12 pages.
Office Action mailed Jan. 10, 2017 in Japan Application No. 2015-552818, 8 pages.
Office Action mailed Jan. 19, 2018 in China Application No. 201480012133.9, 15 pages.
Office Action mailed Jul. 31, 2017 in Korea Application No. 10-2015-7021305, 5 pages.
Office Action mailed Jun. 28, 2016 in Japan Application No. 2015-552818, 13 pages.
Office Action mailed May 19, 2017 in China Application No. 201480012133.9, 17 pages.
Office Action mailed Nov. 25, 2017 in Korea Application No. 10-2015-7021305, 7 pages.
Partial Supplementary European Search Report mailed Aug. 8, 2016 in European Application No. 14738143.8, 8 pages.

* cited by examiner

240

124a 124a 244 124a 124a 244 124a 124a 242

108a 246 132 108a 246 132 108a 246 132

240

130 130 250 130 130

248

124a 124a

132

108a

280

282
Encapsulating a semiconductor device and feature with a first material

284
Forming a second material that covers an outer surface of the first material 286
Contacting the second material with a portion of the feature

SEMICONDUCTOR DEVICE ASSEMBLY WITH THROUGH-PACKAGE INTERCONNECT AND ASSOCIATED SYSTEMS, DEVICES, AND METHODS

CROSS-REFERENCE TO RELATED APPLICATIONS

This application is a continuation of U.S. patent application Ser. No. 16/840,794, filed Apr. 6, 2020, which is a continuation of U.S. patent application Ser. No. 15/941,611, filed Mar. 30, 2018, now U.S. Pat. No. 10,615,154, which is a divisional of U.S. patent application Ser. No. 15/334,069, filed Oct. 25, 2016, now U.S. Pat. No. 9,978,730, which is a divisional of U.S. patent application Ser. No. 14/563,982, filed Dec. 8, 2014, now U.S. Pat. No. 9,508,686, which is a divisional of U.S. patent application Ser. No. 13/739,331, filed Jan. 11, 2013, now U.S. Pat. No. 8,906,743, each of which is incorporated herein by reference.

TECHNICAL FIELD

The present technology is related to forming through-package interconnects that extend through the casings of semiconductor device packages. In particular, some embodiments of the present technology are related to forming such interconnects in assemblies of semiconductor device packages.

BACKGROUND

Packaged semiconductor devices, such as memory chips and microprocessor chips, typically include a semiconductor device mounted to a substrate and encased in a protective covering. The device includes functional features, such a memory cells, processor circuits, and interconnecting circuitry. The device also typically includes bond pads electrically coupled to the functional features. The bond pads are coupled to pins or other types of terminals that extend outside the protective covering for connecting the semiconductor device to buses, circuits and/or other semiconductor devices.

One conventional approach to reducing the surface area occupied by packaged semiconductor devices in compact electronic products is to stack one packaged device on another packaged device having an identical configuration. For example, as shown in FIG. 1, a conventional semiconductor device assembly 10 includes two identical packaged devices 12 (shown as a upper packaged device 12a and a lower packaged device 12b) that are connected to each other and to a printed circuit board (PCB) 14 with solder balls 16. Each packaged device 12 can include a semiconductor die 18 mounted to a support PCB 20 and encased with an encapsulant 22. Each die 18 has die bond pads (not shown) connected with corresponding bond pads 24a of the support PCB 20 with circuitry internal to the support PCB 20. The solder balls 16 connect the bond pads 24a of the upper package 12a to the bond pads 24b of the lower package 12b. Additional solder balls 16 connect the lower package 12b to corresponding bond pads 24b of the PCB 14.

One drawback with the conventional arrangement of FIG. 1 is that the bond pads 24a and 24b contribute to the overall footprint of the assembly 10. In particular, the bond pads 24a and 24b occupy a portion 26 of the perimeter of the PCB 14 and the support PCB 20. Accordingly, there remains a need for improved semiconductor device assemblies that occupy less surface area.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Specific details of several embodiments of methods for forming through-package interconnects that extend the casings of semiconductor device packages are described herein along with related methods, devices, and systems. The term "semiconductor device" generally refers to a solid-state device that includes semiconductor material. Examples of semiconductor devices include logic devices, memory devices, and diodes among others. Furthermore, the term "semiconductor device" can refer to a finished device or to an assembly or other structure at various stages of processing before becoming a finished device. Depending upon the context in which it is used, the term "substrate" can refer to a wafer-level substrate or to a singulated, die-level substrate. A person skilled in the relevant art will recognize that suitable steps of the methods described herein can be performed at the wafer level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques.

The term "semiconductor device package" can refer to an assembly of semiconductor devices that are stacked or otherwise incorporated into a common package. The semiconductor package can include a housing that partially or completely encapsulates the assembly of semiconductor devices. The term "semiconductor device assembly" can refer to an assembly of semiconductor devices. This term can also refer to an assembly of semiconductor devices and a support substrate that is coupled to the assembly of semiconductor devices. Support substrates include printed circuit boards (PCBs) or other suitable substrates that carry the assembly of semiconductor devices and provide electrical connections to the semiconductor device assembly. A person skilled in the relevant art will also understand that the technology may have additional embodiments and that the technology may be practiced without several of the details of the embodiments described below with reference to FIGS. 2-5.

Figure 2:
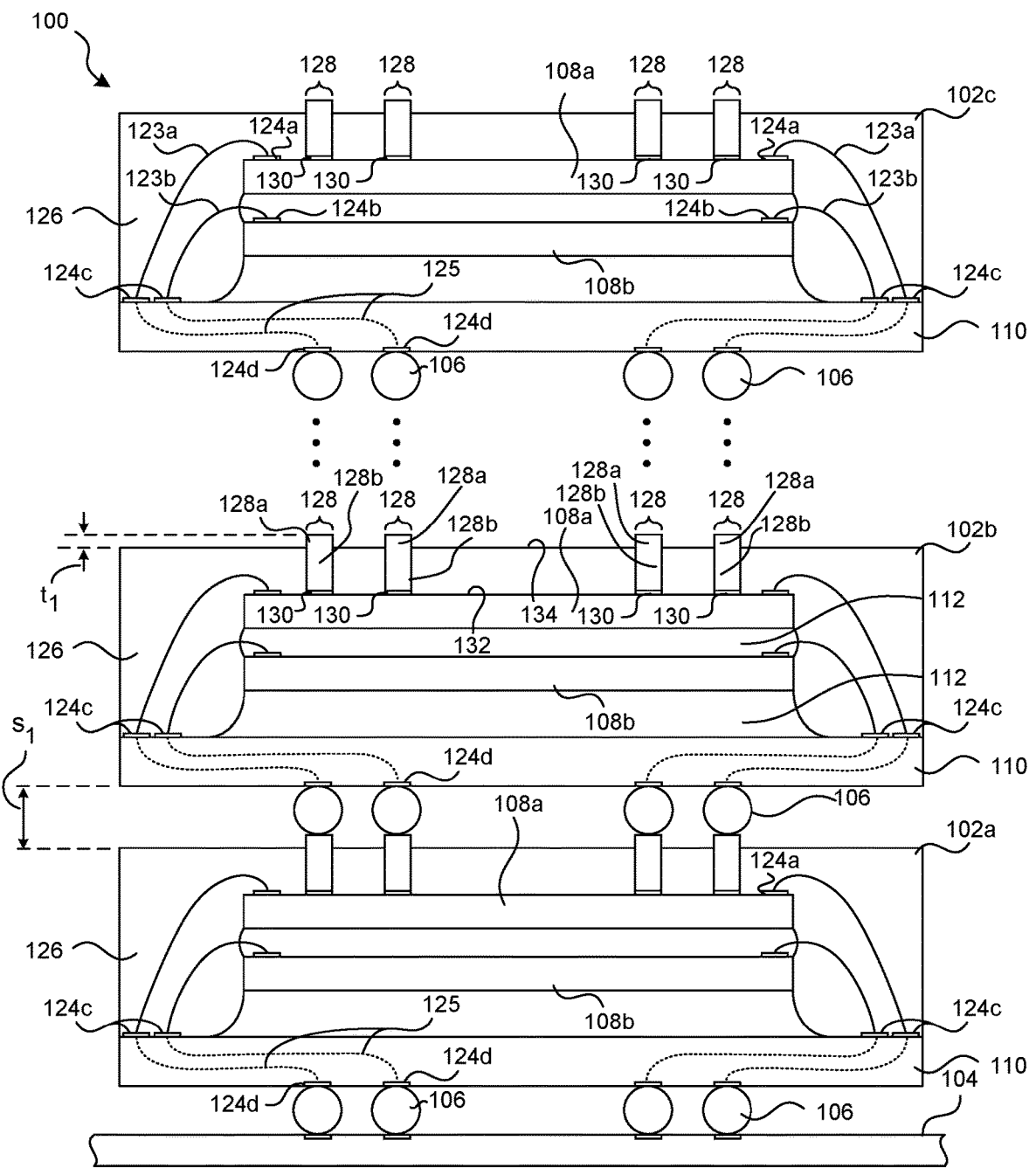
FIG. 2 is a partially schematic and partially exploded, cross-sectional side view of a semiconductor device assembly configured in accordance with selected embodiments of the present technology.

FIG. 2 illustrates a semiconductor device assembly 100 configured in accordance with selected embodiments of the present technology. The device assembly includes semiconductor device packages 102 (shown as first through third packaged devices 102a-102c) that are connected to each other and to a carrier substrate 104 with interconnects 106 (shown as solder balls 106 in FIG. 2). Each device package 102 can include multiple semiconductor dies 108 (identified individually as first semiconductor die 108a and second semiconductor die 108b) that are attached to each other and to a package support substrate 110 through adhesive materials 112, such as epoxies, die-attach tapes, and/or other suitable adhesive materials. Individual device packages 102 can also include first wirebonds 123a coupled to first bond pads 124a of the first semiconductor die 108a and to substrate bond pads 124c of the support substrate 110, and second wirebonds 123b electrically coupled to second bond pads 124b of the second semiconductor die 108b and to other substrate bond pads 124c. The substrate bond pads 124c are electrically coupled to exterior contacts pads 124d through internal circuitry 125 of the support substrate 110. Individual device packages 102 can include a casing 126 encapsulating the semiconductor dies 108 and the first and second wirebonds 123a and 123b. The casing 126 includes an encapsulant, such as a plastic material, epoxy compound, or other suitable dielectric material.

Individual device packages 102 can further include third bond pads 130 at an active surface 132 of the first semiconductor die 108a and through package interconnects 125 electrically coupled to the third bond pads 130. The individual interconnects 128 extend through the casing 126 and have a first portion 128a extending beyond an outer surface 134 of the casing 126 by an offset height $t_1$. A second portion 128b of the interconnect extends between the outer surface 134 of the casing 126 and the individual third bond pads 130 at the first semiconductor die 108a. A redistribution network (not shown) or other suitable network of electrical connections can couple the third bond pads 130 to the first bond pads 124a of the first semiconductor die 108a.

The solder balls 106 between the device packages 102 provide an electrical coupling between the exterior bond pads 124d of the support substrate 110 and the first portions 128a of the through-package interconnects 128. The solder balls 106 and the first portions 128a of the through-package interconnects 128 define a package spacing Si between the device packages 102. In addition, the solder balls 106 and the first portion 128a of the through-package interconnects 128 can provide mechanical support. In some embodiments, the package-spacing Si is reduced by reflow soldering between the exterior bond pads 124d of the support substrate 110 and the first portions 128a of the through-package interconnects 128.

Figure 1:
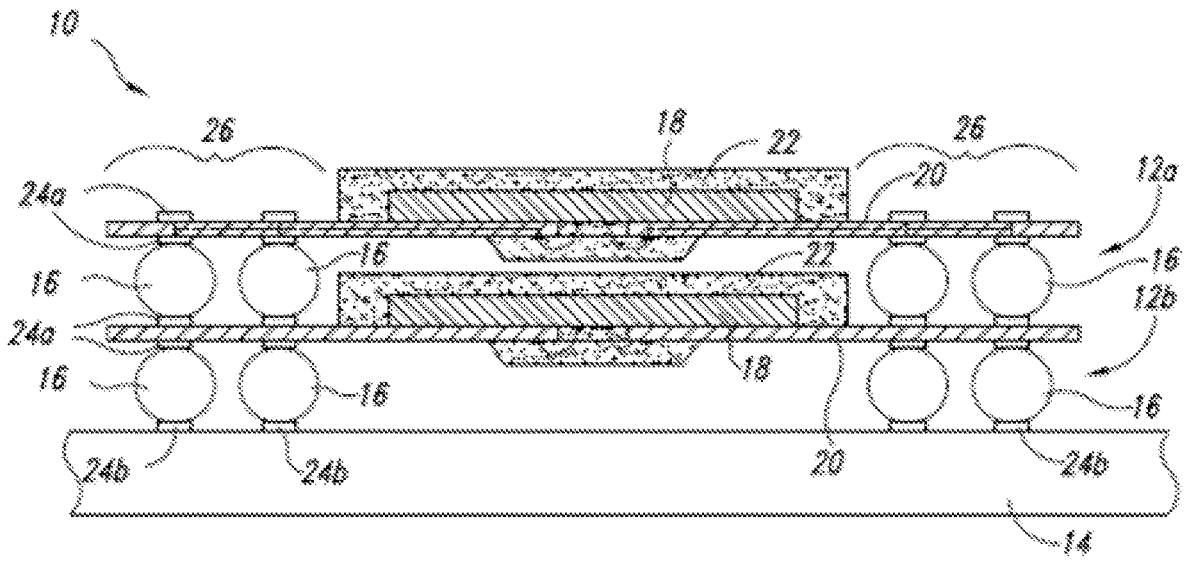
FIG. 1 is a partially schematic, cross-sectional side view of semiconductor device assembly in accordance with the prior art.

In accordance with various embodiments of the present technology, the packaged semiconductor devices 102 provide a semiconductor device assembly having a reduced footprint relative to conventional semiconductor device assemblies, such as the assembly shown in FIG. 1. In particular, the semiconductor device assembly 100 does not require perimeter solder balls, but, rather the through-package interconnects 128 are inboard with respect to a perimeter defined the semiconductor device packages 102 (e.g., the through-package interconnects 128 extend directly away from the first dies 108a completely within an area of the perimeter of the first dies 108a). Thus, the semiconductor device assembly 100 can have a planform shape that is similar or equivalent to the planform shape of the semiconductor device packages 102. In addition, the package spacing $s_1$ does not contribute significantly to the overall projection height of the semiconductor device assembly 100.

A person skilled in the relevant art will recognize that through-package interconnects can be incorporated into a variety of semiconductor device assemblies and/or semiconductor device packages. Accordingly, the semiconductor device assembly 100 and/or the semiconductor device packages 102 can include features and configurations in addition to or in lieu of those illustrated in FIG. 2. For example, the first and second wirebonds 123a and 123b can be replaced with interconnects that extend between the dies 108 of the device packages 102. In such a configuration one or more of the dies 108 can include through substrate vias (i.e., through silicon vias) that extend through the dies 108 and are electrically coupled to interconnects (not shown) between the dies 108 and/or between a die and the support substrate 110. In some embodiments, however, the first and second wirebonds 123a and 123b can be less expensive and less complicated to manufacture than through substrate vias and die-to-die interconnects. Further, in some embodiments, certain features and structures of the semiconductor device assembly 100 and/or the semiconductor device package 102 can be omitted. For example, the semiconductor device packages 102 can include wirebonds that are located on only one side of the semiconductor dies 108 (e.g., the left side of the dies 108 or the right side of the dies 108).

Figure 3A:
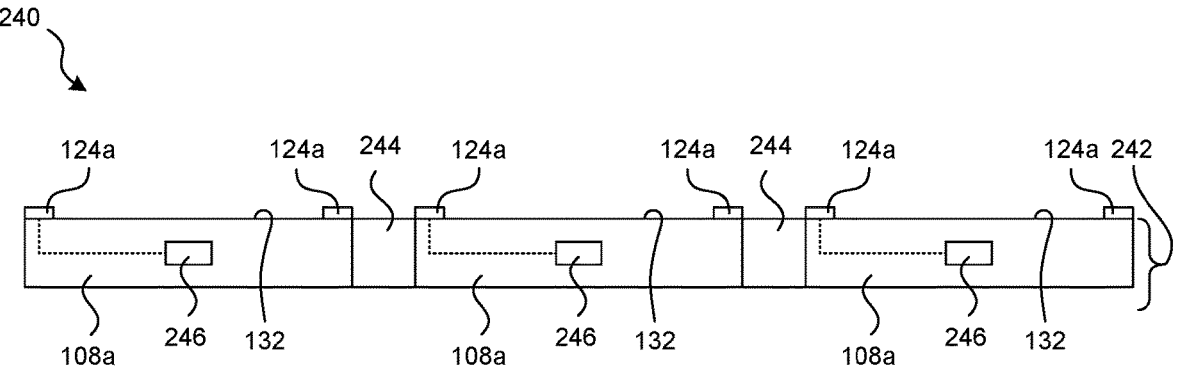
FIGS. 3A-3J are partially schematic cross-sectional views illustrating a semiconductor device at selected steps in a method for making through-package interconnects in accordance with selected embodiments of the present technology.

FIGS. 3A-3J are partially schematic cross-sectional views illustrating a portion of a semiconductor device 240 at various stages in a method for making through-package interconnects or other connectors in accordance with selected embodiments of the present technology. Referring first to FIG. 3A, a semiconductor device 240 includes a substrate 242 (e.g., a silicon wafer) and a plurality of the first semiconductor dies 108a formed in the substrate 242 and separated from one another by dicing lanes 244. The first semiconductor dies 108a have first bond pads 124a at the active surface 132 that have been formed by a back-end-of-line (BEOL) metal deposition process or other suitable metallization process. The first bond pads 124a can include aluminum (Al), nickel (Ni), gold (Au), various alloys, or other suitable conductive materials.

At least a portion of the first bond pads 124a can be electrically coupled to internal circuitry 246 of the first semiconductor die 108a through a network of conductive interconnects and traces. In some embodiments, one or more of the first bond pads 124a can be electrically isolated from the internal circuitry 246. For example, as shown in FIG. 3A, the left-most bond pad 124a is connected to the internal circuitry (as indicated by the broken line coupled the left-most bond pad 124a of the individual semiconductor dies 108a), but the right-most bond pad 124a is not connected to the internal circuitry.

Figure 3B:
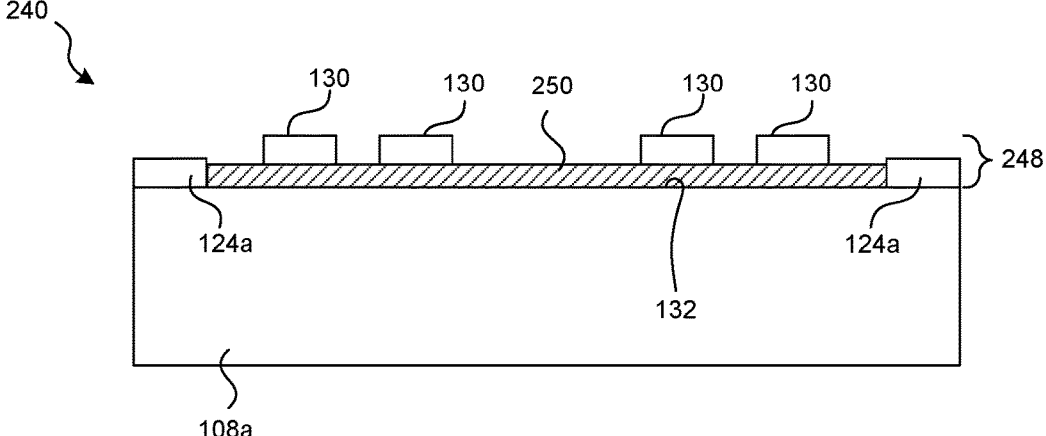

FIG. 3B shows a single first die 108a of the semiconductor device 240 after a redistribution network 248 has been formed at the active surface 132 and the first semiconductor dies 108a have been singulated from the substrate 242 (FIG. 3A). A person skilled in the relevant art will appreciate, however, that the semiconductor device 240 can be manufactured simultaneously with other semiconductor devices. The redistribution network 248 can be formed on a passivation material 250 and can include the third bond pads 130, conductive traces (not shown in FIG. 3B), and other features for electrically connecting the third bond pads 130 with the first bond pads 124a. In some embodiments, the redistribution network 248 can optionally interconnect individual first bonds pads 124a with one another (not shown in the Figures). The passivation material 250 of the redistribution network 248 can include polyimide or other suitable dielectric materials. In addition, the passivation material 250 can be patterned to expose the first bond pads 124a through the passivation material 250. The third bond pads 130 can be directly deposited on the passivation material 250. The conductive traces can be bonded to the first bond pads 124a by depositing a seed material and plating a conductive material on the seed material. In some embodiments, the third bond pads 130 can be formed during the same stage used to form the conductive traces of the redistribution network 248. Alternatively, the third bond pads 130 can be formed in a separate stage. The third bond pads 130 and the conductive traces can include Cu, Ni, titanium (Ti), various alloys, or other suitable materials.

Figure 3C:
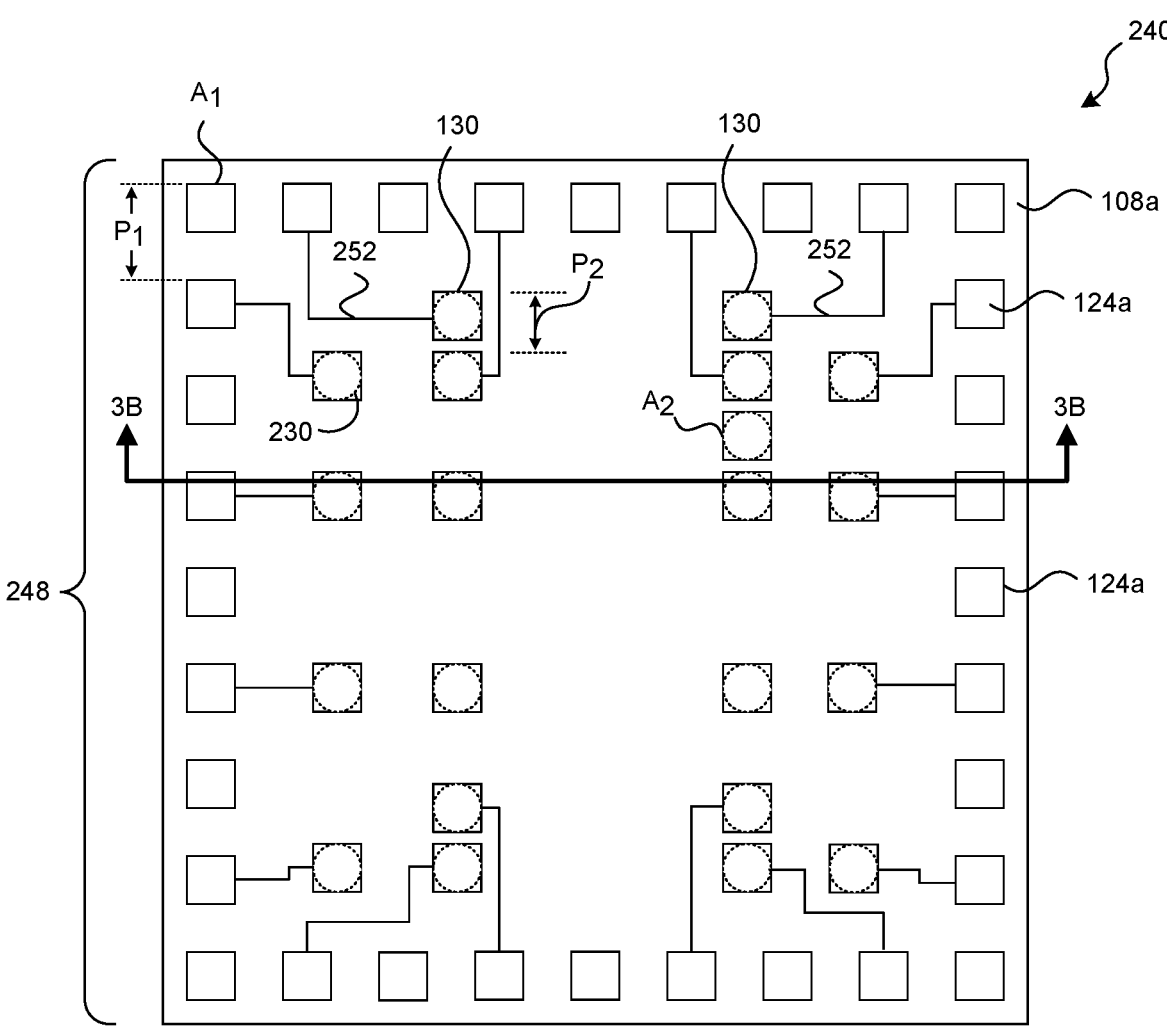

FIG. 3C is a top-plan view of the semiconductor device 240 showing one possible layout of the first bond pads 124a, the third bond pads 130, and conductive traces 252 of the redistribution network 248 at the same stage as shown in FIG. 3B. The first bond pads 124a can have a first surface area $A_1$ and a first pitch $P_1$ that provide a suitable landing surface and spacing for wirebonding or forming other electrical connections. In particular, the surface area $A_1$ and the first pitch $P_1$ can be selected to space the first bond pads 124a apart from one other to prevent electrical shorting of wirebonds connected to the first bond pads 124a (not shown). The third bond pads 130 can have a second surface area $A_2$ that is the same as the first surface area $A_1$ of the first bond pads 124a (as shown), or the second surface area $A_2$ can be smaller or larger than the first surface area $A_1$. Similarly, the third bond pads 130 can have a second pitch $P_2$ that is generally the same as, smaller, or larger than the first pitch $P_1$ of the first bond pads 124a. In some embodiments, a smaller second surface area $A_2$ and/or smaller second pitch $P_2$ of the third bond pads 130 can be achieved because the through-package interconnects 128 (FIG. 2) do not require landing surfaces for wirebonds (e.g., unlike the first bond pads 124a when providing a wirebond location). For example, in some embodiments, an anisotropic conductive material can be used in lieu of the solder balls 106 (FIG. 2) between the individual semiconductor device packages 102. Also, in some embodiments, some or all of the third bond pads 130 can have a shape that is selected to define the shape of the interconnect 128, such as a circular, oval, triangular, or other suitable shape. For example, FIG. 3C shows a circular shape 230 in broken lines that can be an alternative shape to the square shape of the third bond pad 130.

Figure 3D:
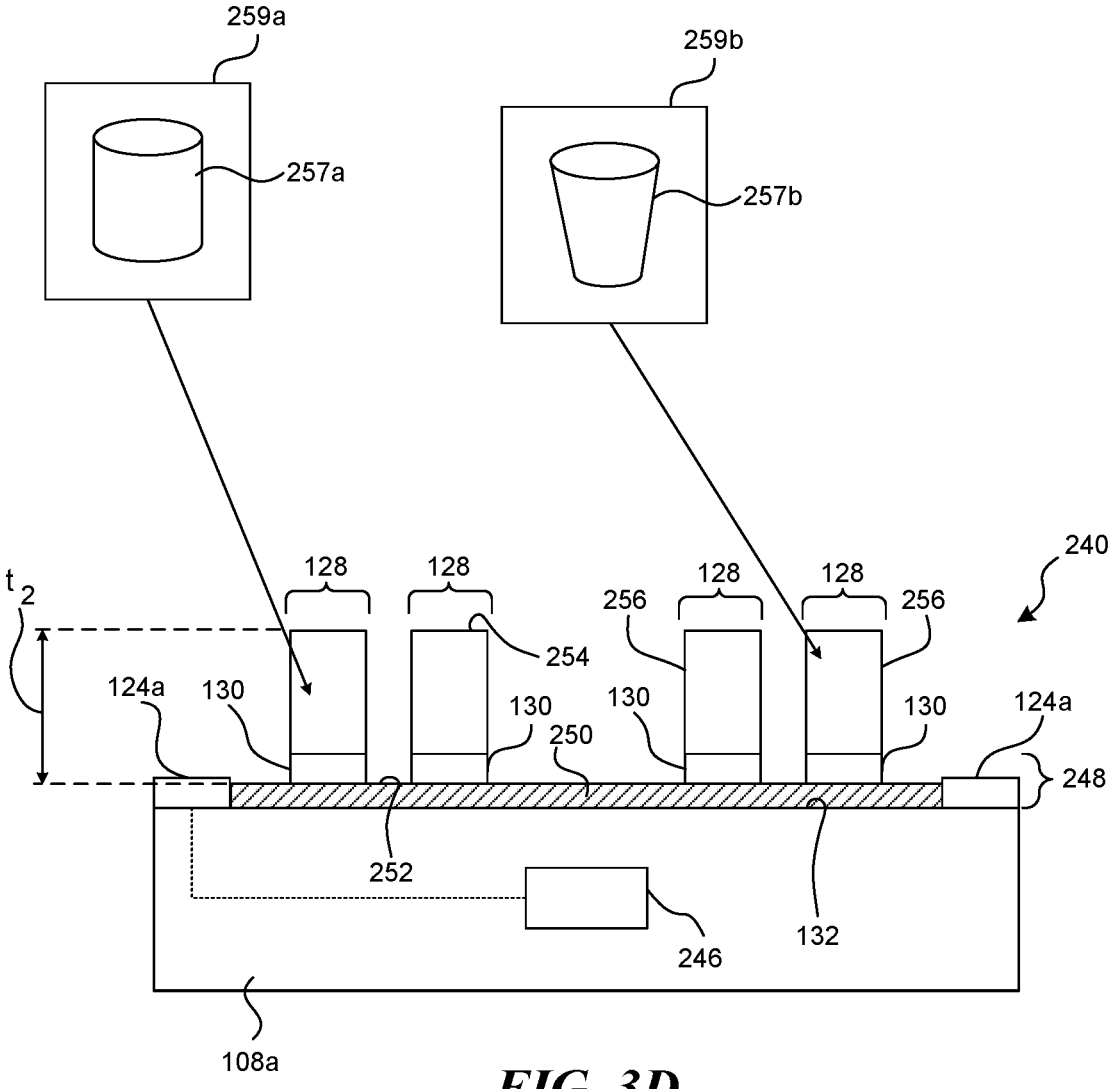

FIG. 3D shows the semiconductor device 240 after forming the through-package interconnects 128 on the third bond pads 130. The individual interconnects 128 can be a pillar, a stand-off structure, or another suitable conductive feature that projects away from the surface 132 of the first semiconductor die 108a. In some embodiments, the through-package interconnects 128 and the third bond pads 130 can include the same material and/or be formed during the same process. As such, the individual interconnects 128 and bond pads 130 can be a homogenous structure in certain embodiments. The individual interconnects 128 and the individual bond pads 130 can together have a projection height $t_2$ above a surface 252 of the passivation material redistribution network 248 (or the surface 132) that is selected for penetrating through the encapsulant of the casing 126 (FIG. 2). The projection height $t_2$ can also be selected such that the individual interconnects extend beyond the height of an arch of a wirebond that is formed at the first bond pad 124a and that projects away from the first die 108a. In some embodiments, the projection height $t_2$ is greater than 50 μm. In other embodiments, the projection height $t_2$ is greater than 100 μm.

The individual interconnects 128 include a contact surface 254 and sidewalls 256 that are transverse to the contact surface 254. The contact surface 254 can be generally planer to provide a suitable surface for a solder connection with other semiconductor devices or conductive features. In addition, the contact surface 254 can be co-planar with the active surface 132 of the first semiconductor die 108a and/or the outer surface 252 of the passivation material 250. The contact surface 254 can have a surface area (not visible in FIG. 3D) that is defined by the second surface area $A_2$ (FIG. 3C) of the individual third bond pads 130.

As shown in FIG. 3D, the sidewalls 256 of the individual interconnects 128 can be substantially vertical or straight to prevent the formation of microvoids during a mold process. For example, a sidewall that is curved or that forms an undercut region can create localized air pockets or voids that do not fill with encapsulant. In addition, an undercut region can limit the size of the contact surface between the individual interconnects 128 and third bond pads 130. A flowing encapsulant can thus potentially cause an interconnect having an undercut region (and a small contact surface) to break free from a bond pad, especially during high-pressure and/or high-flow molding processes. In one embodiment, the individual interconnects have a rectangular shape defined by the sidewalls 256 and the third bond pads 130 (FIG. 3C). However, the interconnect 128 can also have other shapes defined by straight sidewalls, such as a cylindrical shape 257a or a truncated conical shape 257b as shown, respectively, in insets 259a and 259b of FIG. 3D. For example, the cylindrical shape 257a may be formed by electroplating metal onto a circular or oval shaped bond pad. Additionally or alternatively, the truncated conical shape may be defined by the sidewalls of a patterned mask (e.g., a photoresist mask or hard mask) used in an electroless plating process.

The through-package interconnects 128 can be formed by depositing metal or other conductive materials onto the third bond pads 130. Deposition materials and techniques can include any of a variety of materials and techniques known in the art, such as plating of Au, Cu, or other suitable conductive materials. In some embodiments, interconnects can be formed by depositing or plating alternating layers of material. In general, it is expected that plated metal can provide a strong bond with the individual third bond pads 130. Solder deposits (e.g., solder balls), by contrast, can be particularly susceptible to solder joint failures due to mechanical and thermal stresses. Thus, it is expected that electroplated metal is more likely to remain intact than solder during a molding stage. Further, it is expected that the passivation material 250 of the redistribution network 248 can also improve the temperature and pressure tolerances of the through-package interconnects 128 and the third bond pads 130. For example, bonded metal and silicon substrates can have large differences in coefficients of thermal expansion (CTE). Thus, it is expected that the passivation material 250 can provide an insulating buffer that reduces the likelihood of delamination during high temperature processing.

Figure 3E:
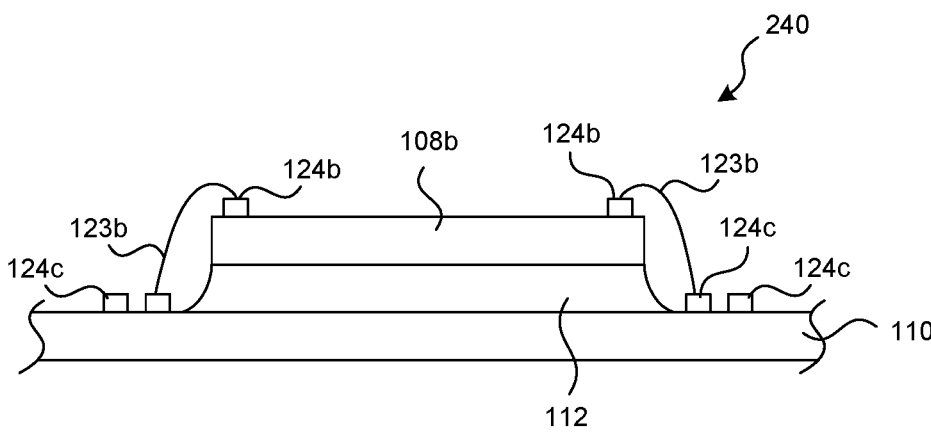
Figure 3F:
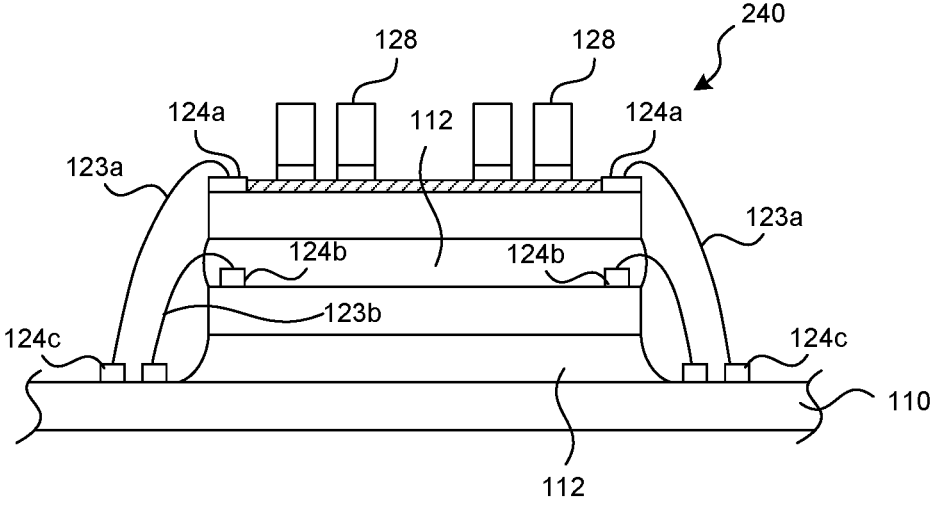

Referring to FIGS. 3E and 3F together, the semiconductor device 240 is shown after attaching the first and second semiconductor dies 108a and 108b to the support substrate 110. As illustrated in FIG. 3E, the second semiconductor die 108b is attached to the support substrate 110 through the adhesive material 112. The second bond pads 124b of the second semiconductor die 108*b* are wirebonded to the substrate bond pads 124*c* of the support substrate 110 with the second wirebonds 123*b*. The second semiconductor die 108*b* can be formed using processes similar to those described above with reference to FIGS. 3A and 3B, but with the exception that a redistribution network can optionally be omitted. As illustrated in FIG. 3F, the first semiconductor second die 108*a* is attached to the second semiconductor second die 108*b* through the adhesive material 112. The first bond pads 124*a* are wirebonded to the substrate bond pads 124*c* of the support substrate 110 with first wirebonds 123*a*.

Figure 3G:
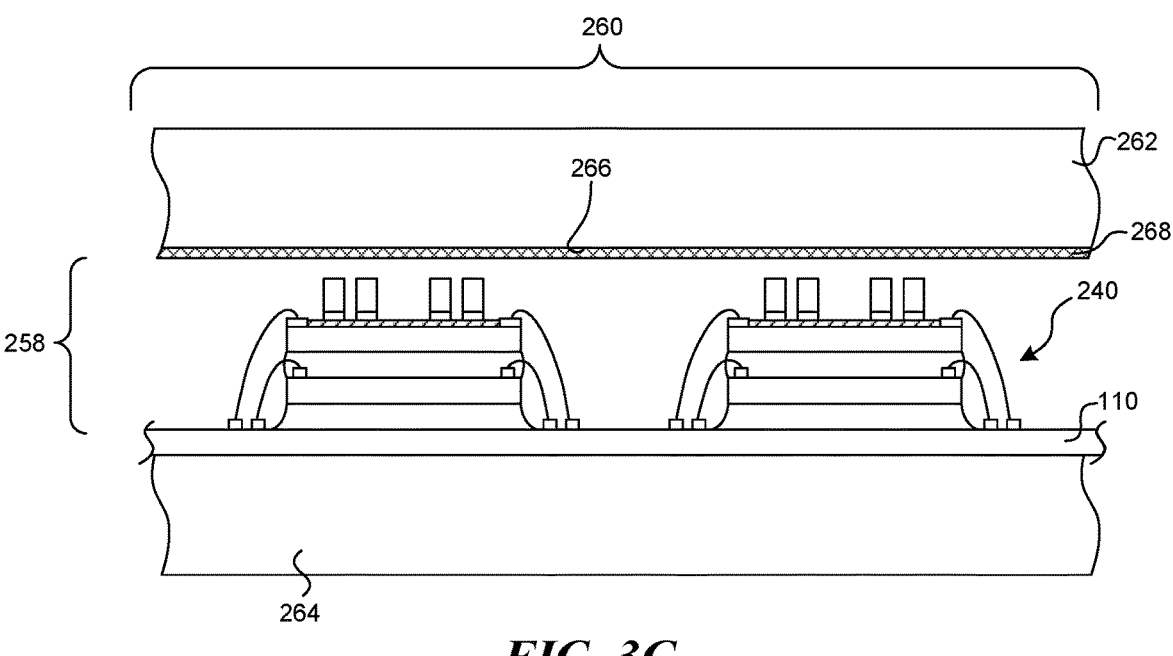

FIG. 3G shows the semiconductor device 240 after receiving the semiconductor device 240 in a mold cavity 258 of a molding apparatus 260. The molding apparatus 260 has an upper molding plate 262 and a lower molding plate 264. The upper molding plate 262 includes a molding surface 266 that is at least partially covered with a spacer material 268 that can be temporarily, semi-permanently, or permanently attached to the molding surface 266. The lower molding plate 264 includes a clamp (not shown) or other suitable structure for positioning and/or holding the semiconductor device 240 below the upper molding plate 262 during a molding stage.

For purposes of clarity, other features of the molding apparatus 260 have been omitted. For example, the molding apparatus 260 can include delivery pumps and injector ports for supplying encapsulant into the mold cavity 258, escape passageways for removing excess encapsulant from the mold cavity 258 during a molding stage, heating elements for curing encapsulant materials, as well as other components for shaping, curing, and defining a mold shape or pattern. In the illustrated embodiments, the molding apparatus 260 can simultaneously mold multiple semiconductor devices carried by the support substrate 110. In other embodiments, however, semiconductor devices can be molded separately. Further, in some embodiments, the lower molding plate 264 and/or the upper molding plate 262 can include a pattern for molding features or indentations in the encapsulant. A person skilled in the relevant art will recognize that many different types of molding plates and apparatus can be employed in the various embodiments of the present disclosure. Suitable molding apparatus and equipment are available from Towa Corp. of Kyoto, Japan; Asahi Engineering Co., Ltd. of Fukuoka, Japan; and BE Semiconductor Industries N.V. (Besi) of Duiven, The Netherlands, to name a few examples.

Figure 3H:
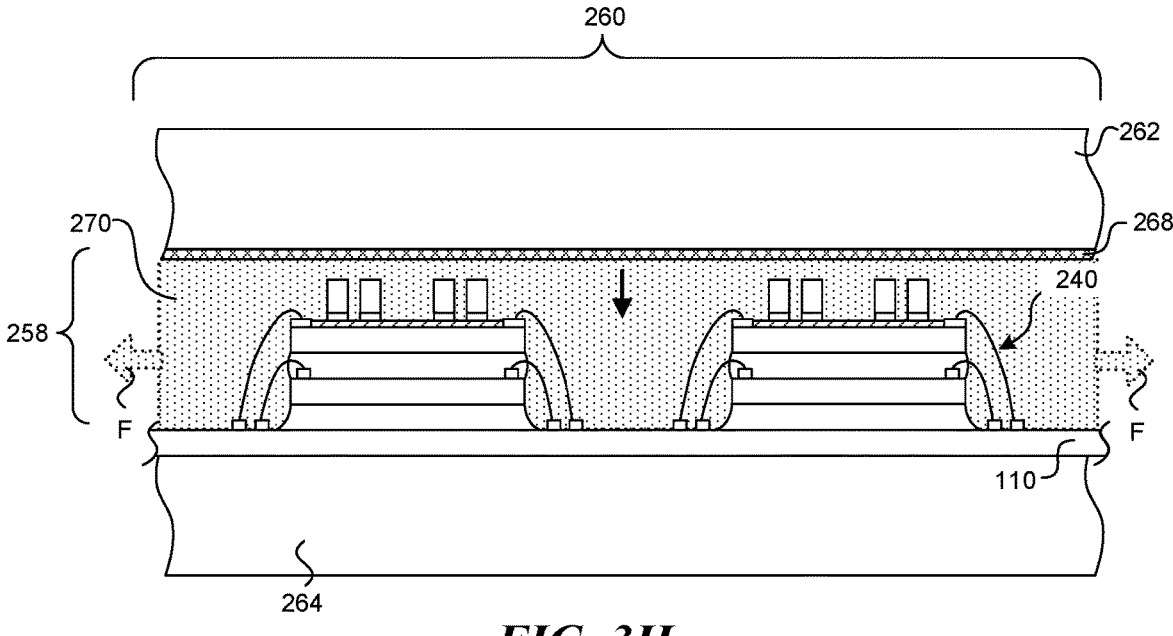

FIG. 3H shows the semiconductor device 240 during a molding stage in which an encapsulant 270 is flowed in the mold cavity 258. The upper and lower molding plates 262 and 264 of the molding apparatus 260 compress the encapsulant 270 to distribute the encapsulant. At least one of the upper and lower molding plates 262 and 264 can be pressed to drive away a portion of the encapsulant 270 as shown by arrow F. Excess encapsulant can be captured in an overflow chamber (not shown). In some embodiments, the encapsulant 270 can be heated to a temperature above room temperature to lower the viscosity of the encapsulant 270 and increase fluid flow rate and/or pressure in the mold cavity 258.

Figure 3I:
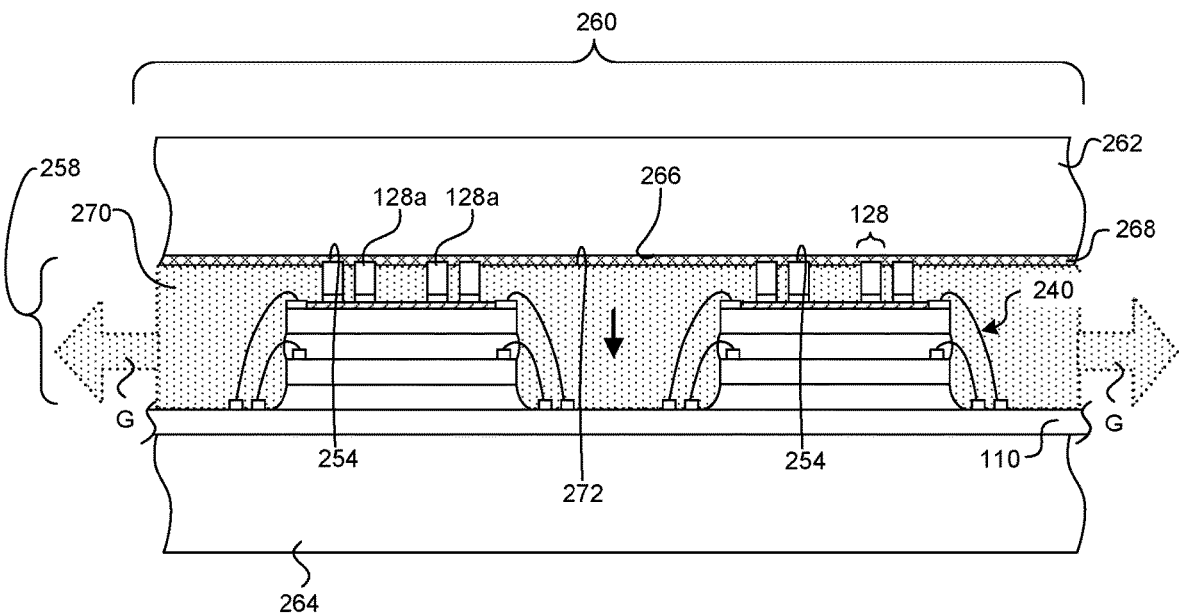

FIG. 3I shows the semiconductor device 240 during a molding stage that occurs after the molding stage of FIG. 3H. The upper and lower plates 262 and 264 of the molding apparatus 260 have been brought closer together to drive away an additional portion of the encapsulant 270 as shown by arrow G. As illustrated, the first portions 128*a* of the through-package interconnects 128 (see also FIG. 2) are exposed. In particular, the first portions 128*a* of the inter-connects 128 have been driven through the encapsulant 270 and into the spacer material 268 such that the first portion 128*a* of the individual interconnects 128 project beyond an outer surface 272 of the encapsulant. The compression of the molding stage of FIG. 3I can apply adequate pressure to ensure that the encapsulant 270 sufficiently covers the semiconductor device 240 but does not cover the contact surface 254 of the individual interconnects 128.

The spacer material 268 can include a film, laminate, or other suitable flexible material that separates the encapsulant 270 from the molding surface 266 of the upper molding plate 262. The spacer material 268 can be engineered to withstand certain process chemistries and temperature ranges. Also, the spacer material 268 can be puncture resistant such that the through-package interconnects 128 are substantially absorbed by the spacer material 268 but do not contact and damage the molding surface 266 of the upper molding plate 262. In addition, and as discussed above with reference to FIG. 3D, the through-package interconnects 128 can be shaped such that the interconnects 128 are readily absorbed by the spacer material 268 without puncturing the spacer material. For example, the contact surface 254 of the inter-connects 128 can distribute pressure uniformly across the spacer material 268. In one embodiment, the spacer material 268 can be a mold-release film, such as polytetrafluoroethylene (PTFE) film. The mold-release film can be a disposable film that protects the molding surface 266 of the upper molding plate 262 and prevents direct contact with the encapsulant and other contaminants.

In some embodiments, the spacer material 268 can be initially formed on a surface of the encapsulant 270 rather than the molding surface 266 of the upper molding plate 262. For example, the spacer material 268 can be formed on the outer surface 272 of the encapsulant 270 before compressing the upper and lower molding plates 262 and 264. Also, in other embodiments, the spacer material 268 can be a material that more readily releases from the molding surface 266 of the upper molding plate 262 but remains attached to the encapsulant encasing the semiconductor device 240. In such a configuration, the spacer material 268 can protect the exposed first portions 128*a* of the through-package interconnects 128 during subsequent processing. The spacer material 268 can be removed before forming electrical connections at the exposed portions 128*a* of the interconnects 128.

Figure 3J:
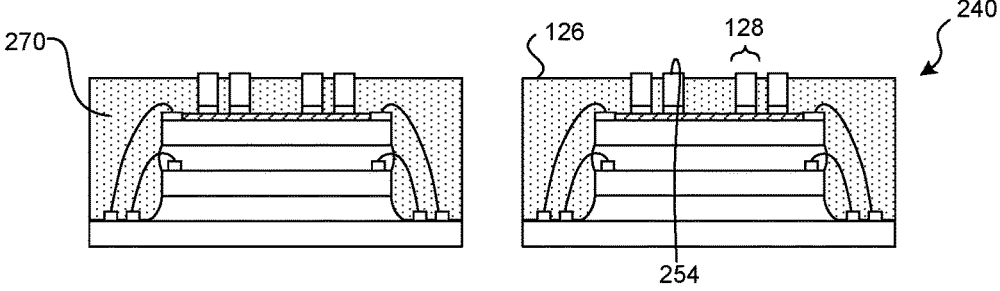

FIG. 3J shows the semiconductor device 240 after forming the casing 126 by curing and/or cooling of the encapsulant 270 and singulation of the individual semiconductor devices 240. Singulation can include blade-, saw-, or laser-cutting processes as well as other suitable processes for isolating the semiconductor device 240 from other devices. Manufacturing of the singulated semiconductor device 240 can continue to other manufacturing stages, such as device testing or assembly. For example, solder flux can be applied at the contact surfaces 254 of the through-package interconnects 128 at a subsequent stage, such as a stage that includes incorporating the semiconductor device 240 into the semiconductor device assembly 100 of FIG. 2.

Figure 4:
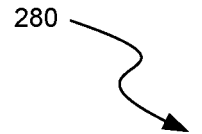
FIG. 4 is a flow diagram of a method for manufacturing a semiconductor device assembly configured in accordance with selected embodiments of the present technology.

FIG. 4 is a flow diagram of a method 280 for manufacturing a semiconductor device assembly configured in accordance with selected embodiments of the present technology. The method 280 can be performed, for example, using any of the processes described above with reference FIGS. 3A-3J. The method 280 includes at least partially encapsulating a semiconductor device and a feature attached to the semiconductor device with a first material (block 282). Block 282 may correspond, for example, to the molding stage of FIG. 3H, which shows the encapsulant 270 covering the semiconductor device 240 and the interconnects 128. In such an embodiment, the first material can include the encapsulant 270 and the feature can include a plated material of the individual interconnects 128.

The method 280 further includes forming a second material that covers an outer surface of the first material (block 284). Block 284 may correspond, for example, to FIGS. 3G and 3H, which show the spacer material 268 in the mold cavity of the molding apparatus 260 and the spacer material 268 formed on the outer surface 272 of the encapsulant 270 (FIG. 3H). In such an embodiment, the second material can include the spacer material 268.

The method 280 further includes contacting the second material with at least a portion of the feature so that the feature extends through the first material (block 286). Block 286 may correspond, for example, to FIG. 3I, which shows the individual interconnects 128 being pressed through the encapsulant 270 and into the spacer material 268. For example, the upper molding plate 260 can be moved towards the semiconductor device 240 to contact the spacer material 268 with the first portion 128a of individual interconnects 128 (FIG. 2). In addition or alternatively, the semiconductor device 240 can be moved towards the upper molding plate 264 so that the individual interconnects 128 are pressed through encapsulant 270 and contact the spacer material 268. For example, the lower molding plate 266 or another suitable mechanical structure (e.g., a press or a mechanical vice) can move the semiconductor device 240 towards the upper plate 264.

Figure 5:
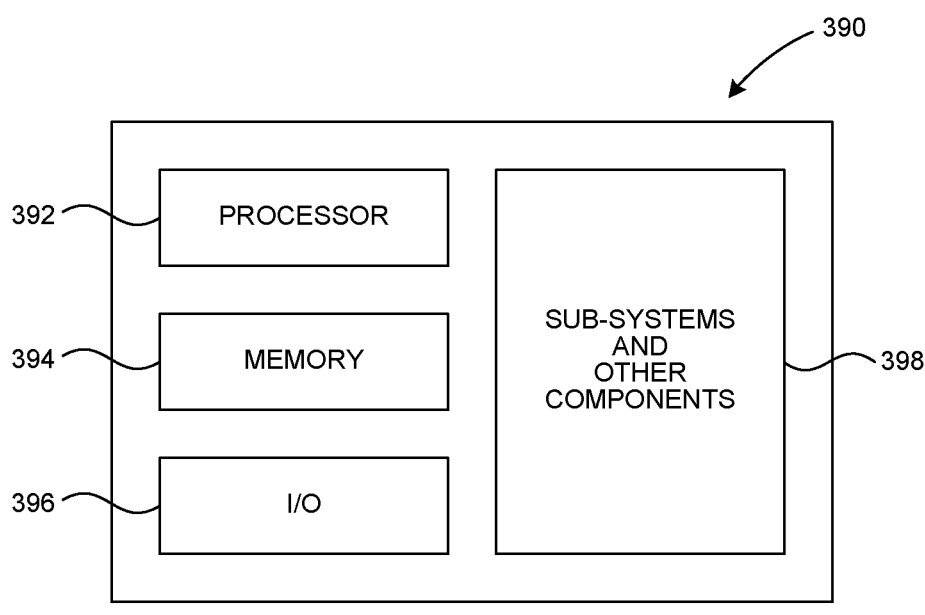
FIG. 5 is a block diagram illustrating a system that incorporates a semiconductor device in accordance with an embodiment of the present technology.

Any one of the semiconductor devices having the features described above with reference to FIGS. 2-3J can be incorporated into any of a myriad of larger and/or more complex systems, a representative example of which is system 390 shown schematically in FIG. 5. The system 390 can include a processor 392, a memory 394 (e.g., SRAM, DRAM, flash, and/or other memory devices), input/output devices 396, and/or other subsystems or components 398. The semiconductor assemblies, devices, and device packages described above with reference to FIGS. 2-3J can be included in any of the elements shown in FIG. 5. The resulting system 390 can be configured to perform any of a wide variety of suitable computing, processing, storage, sensing, imaging, and/or other functions. Accordingly, representative examples of the system 390 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 390 include lights, cameras, vehicles, etc. With regard to these and other examples, the system 390 can be housed in a single unit or distributed over multiple interconnected units, e.g., through a communication network. The components of the system 390 can accordingly include local and/or remote memory storage devices and any of a wide variety of suitable computer-readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. Directional terms, such as "upper," "lower," "front," "back," "vertical," and "horizontal," may be used herein to express and clarify the relationship between various elements. It should be understood that such terms do not denote absolute orientation. Reference herein to "one embodiment," "an embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

We claim:

1. A semiconductor device assembly, comprising:
   a support substrate, a top surface of the support substrate having one or more first bond pads;
   a first semiconductor die carried by the support substrate;
   a second semiconductor die carried by the first semiconductor die, the second semiconductor die having an upper surface and a redistribution network having a second bond pad at the upper surface, wherein the upper surface has a longitudinal footprint;
   an encapsulant encasing the first semiconductor die and the second semiconductor die;
   a wirebond electrically coupled between a first bond pad of the one or more first bond pads on the support substrate and a third bond pad at a top surface of the first semiconductor die, wherein a portion of the wirebond is encased in a material, different from the encapsulant, between the top surface of the first semiconductor die and a bottom surface of the second semiconductor die; and
   a cylindrical interconnect attached to the second bond pad at the upper surface of the second semiconductor die, wherein at least a portion of the cylindrical interconnect extends beyond an outer surface of the encapsulant within the longitudinal footprint of the upper surface, and wherein the cylindrical interconnect has a cylindrical shape with a planar upper surface.

2. The semiconductor device assembly of claim 1 wherein the second semiconductor die further includes a lower surface and a through substrate via electrically connecting the upper surface to the lower surface.

3. The semiconductor device assembly of claim 2 wherein the through substrate via is electrically coupled to the first semiconductor die at the lower surface of the second semiconductor die.

4. The semiconductor device assembly of claim 2 wherein the first semiconductor die comprises the top surface, a bottom surface, and a second through substrate via electrically connecting the top surface to the bottom surface.

5. The semiconductor device assembly of claim 1 wherein the semiconductor device assembly further comprises a second wirebond electrically coupled between a second surface bond pad on the support substrate and a fourth bond pad coupled with the upper surface of the redistribution network.

6. The semiconductor device assembly of claim 5 wherein the second bond pad is electrically coupled to the fourth bond pad through a conductive trace in the redistribution network.

7. A semiconductor device assembly, comprising:
a support substrate comprising one or more first bond pads;
a first semiconductor device carried by the support substrate, the first semiconductor device comprising:
a second bond pad at a top surface of the first semiconductor device; and
a wirebond;
a second semiconductor device carried by the first semiconductor device, the second semiconductor device comprising:
an upper surface and a lower surface, wherein the wirebond is electrically coupled between a first bond pad of the one or more first bond pads and the second bond pad, wherein a portion of the wirebond is encased in a material between the top surface of the first semiconductor device and the lower surface of the second semiconductor device;
an array of third bond pads at the upper surface; and
a redistribution network at the upper surface, the redistribution network having an array of fourth bond pads;
an encapsulant encasing the first semiconductor device and the second semiconductor device, wherein the material is different from the encapsulant; and
an array of cylindrical interconnects each attached to a corresponding fourth bond pad in the array of fourth bond pads, wherein at least a portion of each cylindrical interconnect in the array of interconnects extends beyond an outer surface of the encapsulant, and wherein each cylindrical interconnect of the array of cylindrical interconnects has a cylindrical shape with a planar upper surface.

8. The semiconductor device assembly of claim 7 wherein the upper surface includes central portion having a passivation material, wherein the redistribution network is formed in the passivation material and the array of fourth bond pads is carried by the passivation material, and wherein the array of third bond pads is carried by a peripheral portion of the upper surface.

9. The semiconductor device assembly of claim 7 wherein a top surface of each of the third bond pads is at a first elevation, and wherein a top surface of each of the fourth bond pads is at a second elevation higher than the first elevation.

10. The semiconductor device assembly of claim 7 wherein the array of third bond pads has a first pitch, and wherein the array of fourth bond pads has a second pitch smaller than the first pitch.

11. The semiconductor device assembly of claim 7 wherein each third bond pad in the array of third bond pads has a first surface area, and wherein each fourth bond pad in the array of fourth bond pads has a second surface area smaller than the first surface area.

12. The semiconductor device assembly of claim 7, wherein each individual third bond pad in the array of third bond pads is electrically coupled to a corresponding substrate bond pad on the support substrate through a second wirebond.

13. The semiconductor device assembly of claim 7 wherein the array of fourth bond pads is electrically coupled to the array of third bond pads through one or more traces in the redistribution network.

14. The semiconductor device assembly of claim 7 wherein the second semiconductor device further comprises internal circuitry, and wherein one or more third bond pads in the array of third bond pads is electrically coupled to the internal circuitry.

15. A stacked semiconductor package assembly, comprising:
a first semiconductor package, the first semiconductor package comprising:
a first support substrate having a first surface and a second surface opposite the first surface, wherein the first surface includes one or more substrate bond pads, and wherein the second surface includes one or more exterior bond pads;
a first semiconductor die carried by the first surface of the first support substrate, the first semiconductor die having an active surface and one or more first bond pads at the active surface;
a second semiconductor die carried by the first semiconductor die;
one or more wirebonds extending between individual pairs of the one or more first bond pads and the one or more substrate bond pads; and
a first encapsulant encasing the first semiconductor die and the one or more wirebonds, wherein respective portions of the one or more wirebonds are encased in a material, different from the first encapsulant, between the active surface of the first semiconductor die and a bottom surface of the second semiconductor die; and
a second semiconductor package, the second semiconductor package comprising:
a second support substrate;
a third semiconductor die carried by the second support substrate, the third semiconductor die having an active surface and a redistribution network at the active surface, wherein the redistribution network includes one or more second bond pads;
a second encapsulant encasing the third semiconductor die; and
one or more cylindrical interconnects individually attached to each of the one or more second bond pads, wherein at least a portion of each cylindrical interconnect of the one or more cylindrical interconnects extends beyond an outer surface of the second encapsulant and is electrically coupled to the one or more exterior bond pads on the second surface of the first support substrate, and wherein each cylindrical interconnect of the one or more cylindrical interconnects has a cylindrical shape with a planar upper surface.

16. The stacked semiconductor package assembly of claim 15, further comprising one or more solder balls electrically coupling corresponding pairs of the one or more cylindrical interconnects and the one or more exterior bond pads on the second surface of the first support substrate.

17. The stacked semiconductor package assembly of claim 15 wherein each cylindrical interconnect of the one or more cylindrical interconnects is vertically aligned with the active surface of the second semiconductor die.

* * * * *